(12) United States Patent
Back

(10) Patent No.: US 6,933,196 B2
(45) Date of Patent: Aug. 23, 2005

(54) ISOLATION STRUCTURE AND METHOD FOR SEMICONDUCTOR DEVICE

(75) Inventor: Jong-Hak Back, Seoul (KR)

(73) Assignee: Hyundai Electronics Industries Co., Ltd., Inchon-shi (KR)

( * ) Notice: Subject to any disclaimer, the term of this patent is extended or adjusted under 35 U.S.C. 154(b) by 0 days.

(21) Appl. No.: 10/356,477

(22) Filed: Feb. 3, 2003

(65) Prior Publication Data

US 2003/0137013 A1 Jul. 24, 2003

Related U.S. Application Data

(62) Division of application No. 09/479,887, filed on Jan. 10, 2000, now Pat. No. 6,538,286.

(30) Foreign Application Priority Data

Apr. 16, 1999 (KR) ........................................ 1999-13577

(51) Int. Cl.[7] .................... H01L 21/336; H01L 21/3205
(52) U.S. Cl. ........................ 438/259; 438/270; 438/589
(58) Field of Search ................................ 438/164, 412, 438/206, 259, 270, 589

(56) References Cited

U.S. PATENT DOCUMENTS

| 5,327,006 A | 7/1994 | Beasom ........................ 257/583 |
|---|---|---|
| 5,420,458 A | 5/1995 | Shimoji ........................ 257/622 |
| 5,512,777 A * | 4/1996 | Endo ............................ 257/617 |
| 5,554,870 A | 9/1996 | Fitch et al. .................. 257/334 |
| 5,894,164 A | 4/1999 | Funaki et al. ................ 257/654 |
| 5,895,951 A * | 4/1999 | So et al. ....................... 257/330 |
| 6,025,237 A | 2/2000 | Choi ............................ 438/301 |
| 6,078,090 A | 6/2000 | Williams et al. ............. 257/476 |
| 6,087,222 A | 7/2000 | Jung Lin et al. ............ 438/259 |
| 6,130,458 A | 10/2000 | Takagi et al. ................ 257/351 |
| 6,133,077 A * | 10/2000 | Randazzo ..................... 438/199 |
| 6,143,594 A | 11/2000 | Tsao et al. ................... 438/199 |
| 6,146,970 A | 11/2000 | Witek et al. .................. 438/424 |
| 6,214,675 B1 | 4/2001 | Cochran et al. ............. 438/275 |
| 6,362,025 B1 * | 3/2002 | Patti et al. ................... 438/138 |

* cited by examiner

Primary Examiner—Amir Zarabian
Assistant Examiner—Pamela E Perkins
(74) Attorney, Agent, or Firm—Fleshner & Kim, LLP

(57) ABSTRACT

A device isolation structure and method for a semiconductor device according to the present invention includes forming first and second trenches by etching predetermined regions of a semiconductor substrate, forming a buried insulating film in the trenches, filling in the trenches by depositing single crystal silicon film on the buried insulating film by a silicon epitaxy method, and forming a field insulating film on portions of the semiconductor substrate between the first and second trenches. The field oxide film isolating the single crystal silicon layers fills the adjacent trenches, thus isolating semiconductor devices, such as a high voltage device and a low voltage device, to be fabricated in the single crystal silicon layers.

17 Claims, 4 Drawing Sheets

HV REGION | F1 REGION | LV REGION

ISOLATION STRUCTURE AND METHOD FOR SEMICONDUCTOR DEVICE

This application is a Divisional of application Ser. No. 09/479,887 filed Jan. 10, 2000 now U.S. Pat. No. 6,538,286.

BACKGROUND OF THE INVENTION

1. Field of the Invention

The present invention relates to a semiconductor device and more particularly to a semiconductor device having a high voltage (HV) device and a low voltage (LV) device on a silicon on insulator (SOI) substrate and a method of making the same.

2. Background of the Related Art

A background art substrate having a thick epitaxial layer can implement a high voltage (HV) breakdown. Because a device can operate at a relatively high voltage by forming a relatively large depletion region with a deep junction depth, an HV device can be formed in the substrate by forming a deep well in the epitaxial layer, using a long drive-in process.

Because diffusion must occur at a temperature of about 1200° C. for at least about 1000 minutes when forming the background art deep well, processing time is unavoidably lengthened and throughput is reduced. Further, since a junction isolation or a self-isolation process is required to isolate an HV trench region (TR) from a low voltage (LV) TR, a chip size must be large, thus causing difficulty in integrating the isolation process with a normal CMOS process.

To address the above-described background art problems, a background art power integrated circuit (IC) technique using a silicon on insulator (SOI) substrate is employed. A SOI power IC does not require a deep junction, and the power IC technique can reduce the chip size by implementing a trench isolation between HV and LV devices. Further, the power IC technique considerably improves a fabrication throughput, and enables integration with the normal CMOS process.

FIGS. 1A through 1D illustrate cross-sectional views of a background art semiconductor device isolation method. FIG. 1A shows a buried insulating layer 3 formed on a semiconductor substrate 1, and a P-type single crystal silicon layer 5 formed on the buried insulating layer 3 by silicon epitaxy, at a thickness of about 500–2000 Å. Next, a pad oxide film 7 is formed on the single crystal silicon layer 5 by thermal oxidation, and a mask layer 9 is formed on the pad oxide film 7 by chemical vapor deposition (CVD) of silicon nitrite.

FIG. 1B shows the mask layer 9 and the pad oxide film 7 being patterned by a photo-etching method to expose the single crystal silicon layer 5. An HV region, an LV region and a field region are accordingly formed, where the field region electrically insulates the HV region from the LV region.

Next, an anisotropic etching process, such as a reactive ion etching method (RIE), is used to form a trench 11 in the single crystal silicon layer 5, using the mask layer 9 as an etching mask. The trench 11 exposes the buried insulating layer 3.

FIG. 1C shows the substrate of FIG. 1B with the mask layer 9 and the pad oxide film 7 removed to expose a surface of the single crystal silicon layer 5. A silicon oxide layer 13 is deposited by CVD on the crystal silicon layer 5 to fill the trench 11. Then, as shown in FIG. 1D, an etchback process, such as RIE or chemical mechanical polishing (CMP), is applied to the silicon oxide layer 13 to expose the single crystal silicon layer 5. As a result, a field oxide film 13 is formed in the trench 11, and the background art semiconductor device isolation method is completed and followed by fabrication of a background art integrated circuit.

FIG. 2 illustrates a cross-sectional diagram of a semiconductor device fabricated on the substrate shown in FIG. 1D. N-type drift regions 15 are formed in the single crystal silicon layer 5 of the HV and LV regions by a single process, and a P-well region 17 is formed adjacent to the N-type drift region 15 of the HV region. Further, gate electrodes 19 having a gate oxide film (not shown) are formed on the single crystal silicon layer 5 in the HV and LV regions, and N-type impurity regions are formed as source S and drain D regions in the single crystal silicon layer 5 at both sides of each gate electrode 19.

An N-type body contact region 21 is formed adjacent to the source region S of the HV region, and a metal field plate electrode 23 is formed on the single crystal layer 5 on the drift region 15 of the HV region. The drain region D of the HV region is separated from the gate electrode 19 of the drift region 15, and the metal field plate electrode 23 is insulated from the single crystal layer 15 and the gate electrode 19.

The background art has various problems and disadvantages. In the background art semiconductor device isolation method, the HV and LV regions are isolated from each other by the trench 11 and the buried insulating layer 3. Thus, conduction of heat generated during the operation of the device is blocked, and a heat accumulation problem results. Additionally, the trench process is complicated by a dielectric isolation (DI) requirement, and the manufacturing cost of the semiconductor device is increased by the required use of an expensive SOI substrate.

SUMMARY OF THE INVENTION

An object of the present invention is to obviate at least one or more of the problems and disadvantages in the background art and to provide at least the following advantages.

Another object of the invention is to reduce the cost and/or complexity of the fabricating process.

Another object of the present invention is to obviate the problem of heat generation.

It is also an object of the present invention to achieve a simple fabricating process that does not require the lengthy and complex drive-in and trench processes.

To achieve these and other advantages and in accordance with the purpose of the present invention, as embodied and broadly described herein, there is provided a semiconductor device isolation structure, which includes a semiconductor substrate having first and second trenches, a first insulating film formed on the first and second trenches, first conductive type regions formed on the first insulating film to fill in the first and second trenches, and a second insulating film formed on parts of the semiconductor substrate corresponding to the first and second trenches.

Also, to achieve the objects of the present invention, there is provided a semiconductor device isolation method, which comprises the steps of forming first and second trenches on a semiconductor substrate; forming a first insulating film on the first and second trenches; forming first conductive type patterns on the first insulating film to fill in the first and second trenches; and forming a second insulating film by oxidizing a part of the semiconductor substrate between the first and second trenches.

An alternative semiconductor device isolation method embodying the present invention includes the steps of: forming a pad oxide film on the semiconductor substrate; forming a mask layer on the pad oxide film; partially exposing an upper surface of the semiconductor substrate by removing parts of the pad oxide film and the mask layer corresponding to first and second trench regions; forming first and second trenches by applying an anisotropic etching process to the semiconductor substrate using the mask layer as an etching mask; forming a first insulating film in the first and second trenches; forming first conductive type single crystal patterns in the first and second trenches, respectively, such that a portion of the semiconductor substrate remains exposed; and forming a second insulating film by oxidizing the exposed portion of the semiconductor substrate.

A semiconductor device embodying the present invention includes a semiconductor substrate having first and second trenches; a first insulating film formed on the first and second trenches; first conductive type single crystal silicon patterns formed on the first insulating film to fill in the first and second trenches, respectively; a second insulating film formed on a part of the semiconductor substrate between the first and second trenches; a second conductive type drift region formed in the first conductive type single crystal silicon patterns of the first and second trenches; a first conductive type well region formed in the single crystal silicon pattern in the first trench; gate electrodes formed on the single crystal silicon patterns in the first and second trenches by forming a gate insulating film therein; second conductive type impurity regions formed in the single crystal silicon patterns at both sides of each gate electrode, the second conductive type impurity regions being used as a source or a drain; a first conductive type body contact region formed in the first conductive type well region of an HV region; and a metal field plate electrode formed on the single crystal silicon layer in the first trench.

A fabrication method of a semiconductor device embodying the present invention includes forming a pad oxide film on a semiconductor substrate; forming a mask layer on the pad oxide film; removing parts of the pad oxide film and the mask layer corresponding to first and second trench regions; forming first and second trenches by etching the semiconductor substrate using the mask layer as an etching mask; forming a first insulating film in the first and second trenches; forming a first conductive type single crystal silicon pattern over the semiconductor substrate including the buried insulating film to fill in the trenches; partially removing the first conductive type single crystal silicon pattern by an etching process to expose a part of a top surface of the semiconductor substrate between the first and second trenches; forming a second insulating film by oxidizing the exposed part of the semiconductor substrate; forming a second conductive type drift region in single crystal silicon patterns formed in the first and second trenches, respectively; forming a first conductive type well region in the first trench; forming gate electrodes on predetermined regions of the single crystal silicon patterns formed in the first and second trenches, the gate electrodes having a gate insulating film therein; forming impurity regions in the single crystal silicon patterns at both sides of the gate electrodes, the impurity regions being used as source or drain; forming a first conductive type body contact region in a well region of an HV region; and forming a metal field plate electrode on a part of the single crystal silicon pattern corresponding to the drift region in the first trench.

An alternative semiconductor device embodying the present invention includes a substrate comprising a semiconductor material; a first conductive region on a first portion of the substrate; a second conductive region on a second portion of the substrate; and an intermediate insulating region comprising a third portion of the substrate, said intermediate insulating region separating the first and second conductive regions.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
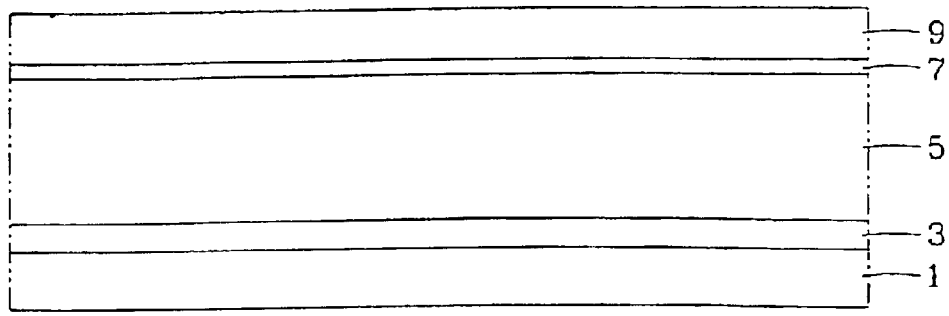
FIGS. 1A through 1D illustrate cross-sectional views of a background art semiconductor device isolation method.
Figure 1B:
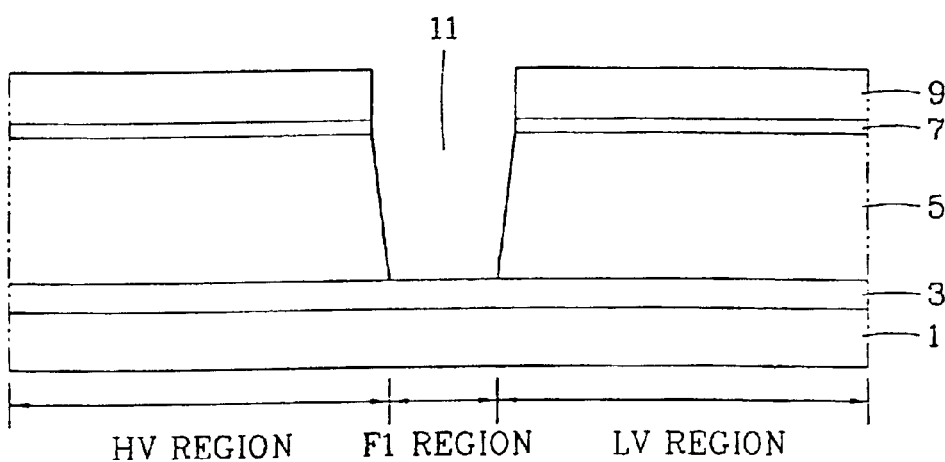
Figure 1C:
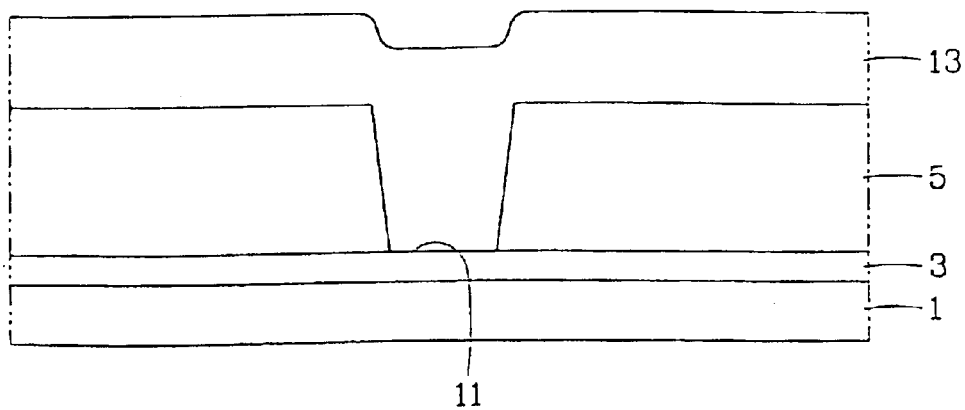
Figure 1D:
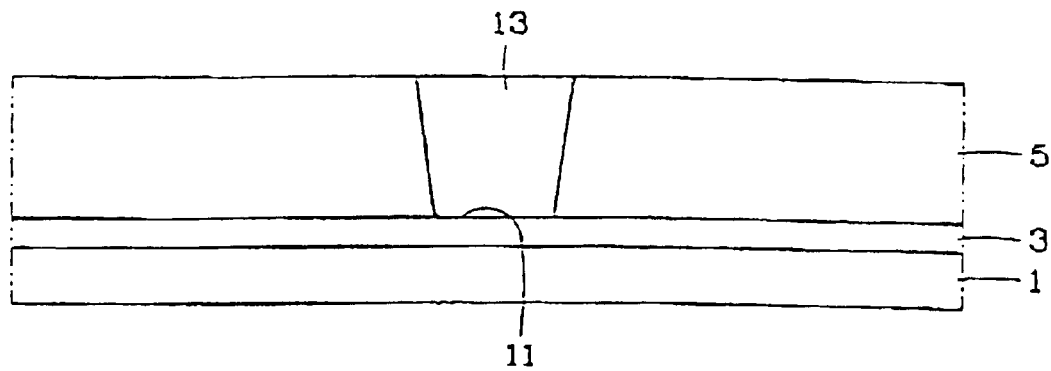
Figure 2:
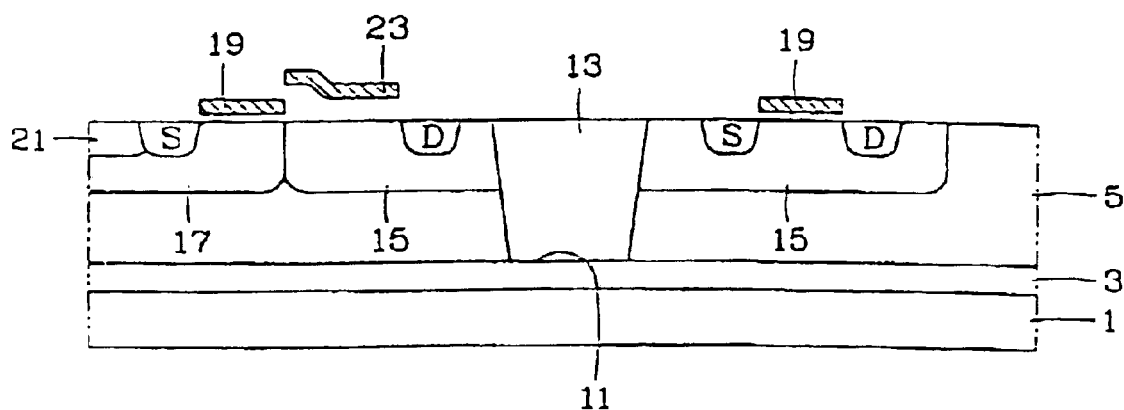
FIG. 2 illustrates a cross-sectional view of a background art semiconductor device fabricated on the structure shown in FIG. 1D.
Figure 3:
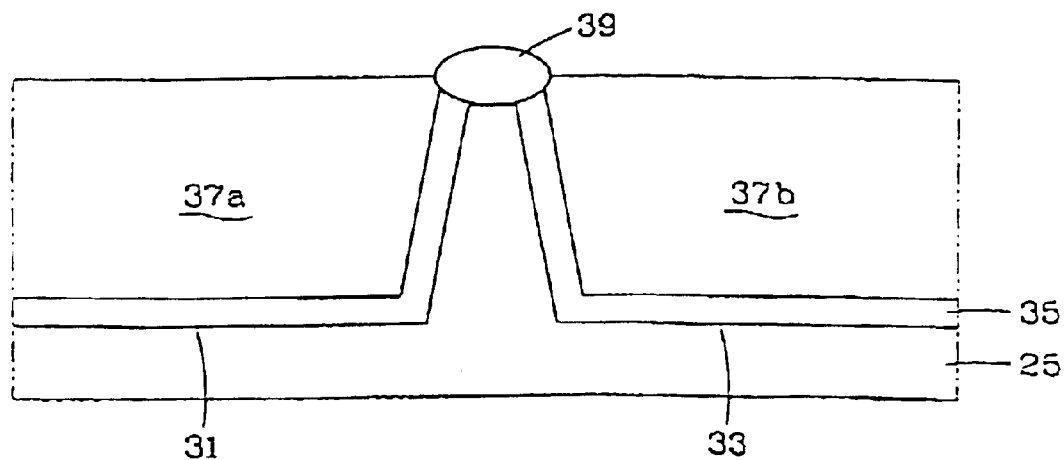
FIG. 3 illustrates a cross-sectional view of a semiconductor device isolation structure according to a preferred embodiment of the present invention.

FIG. 3 illustrates a cross-sectional view of a semiconductor device isolation structure according to a preferred embodiment of the present invention. A first trench 31 and a second trench 33 are formed in a semiconductor substrate 25, and a buried insulating oxide film 35 is formed in the trenches 31, 33. Then, first conductive P-type or N-type single crystal silicon patterns 37a, 37b are formed on the buried insulating film 35 to fill in the first and second trenches 31, 33, respectively.

A field oxide film 39 is then formed on a portion of the semiconductor substrate 25 positioned between the first and second trenches 31, 33. The field oxide film 39 isolates semiconductor devices to be formed in the first and second single crystal silicon patterns 37a, 37b. An HV device and an LV device (not shown) are formed in the first single crystal silicon pattern 37a of the first trench 31 and the second single crystal silicon pattern 37b of the second trench 33, respectively.

Figure 4A:
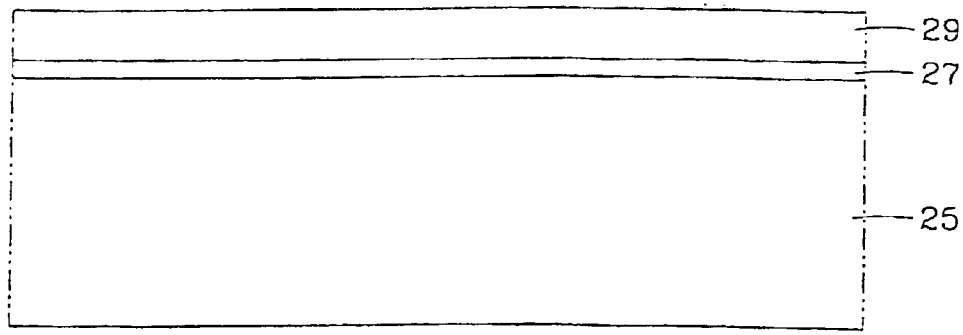
FIGS. 4A through 4D illustrate cross-sectional views of a semiconductor device isolation method according to a preferred embodiment of the present invention.

FIGS. 4A through 4D illustrate cross-sectional views of a semiconductor device isolation method according to the preferred embodiment of the present invention. As shown in FIG. 4A, a pad oxide film 27 is formed on the semiconductor substrate 25, and a mask layer 29 is formed by a chemical vapor deposition (CVD) of silicon nitride on the pad oxide film 27. A surface of the semiconductor substrate 25 is exposed by patterning the mask layer 29 and the pad oxide film 27 by a photo-etching method (not shown).

Figure 4B:
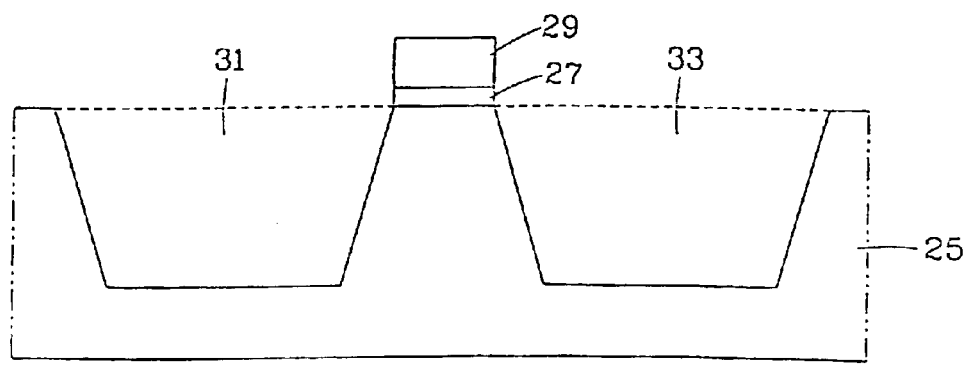

As shown in FIG. 4B, the mask layer 29 is used as an etching mask co form first and second trenches 31, 33 by applying an anisotropic etching process, such as reactive ion etching (RIE), to the exposed surface of the semiconductor substrate 25. Then, the first mask layer 29 and the first pad oxide film 27 are removed to expose the surface of the semiconductor substrate 25.

Figure 4C:
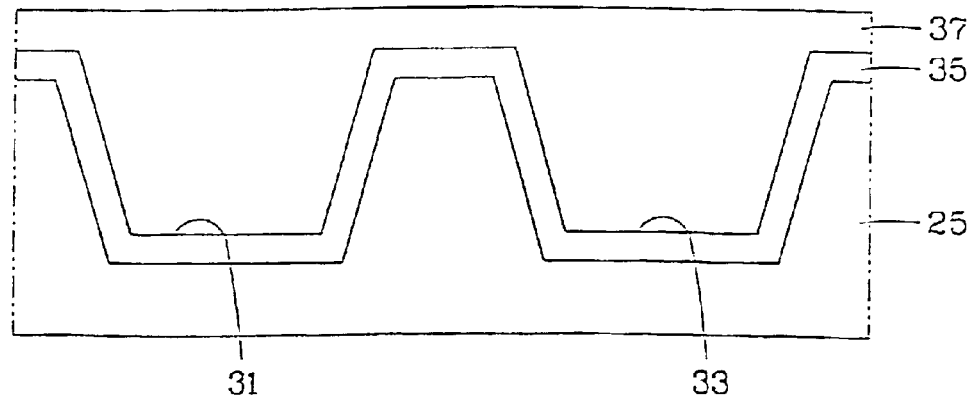

As shown in FIG. 4C, a buried insulating film 35 is formed on the surface of the substrate 25 and in the trenches 31, 33. A first conductive type single crystal silicon layer 37 is then deposited on the buried insulating film 35 to fill in the first and second trenches 31, 33 by the epitaxial growth method.

Figure 4D:
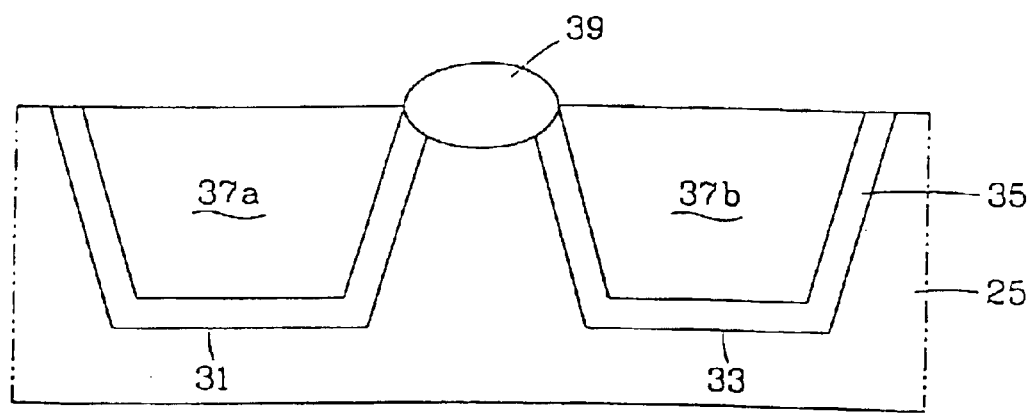

As shown in FIG. 4D, an etchback method, such as RIE or chemical mechanical polishing (CMP), is then applied to the single crystal silicon layer 37 to expose a portion of the surface of the semiconductor substrate 25 between the trenches 31, 33. Thus, first and second single crystal silicon layer patterns 37a, 37b are formed in the first and second trenches 31, 33, respectively. Then, the HV device and the LV device are formed in the first and second single crystal silicon layer patterns 37a, 37b of the first and second trenches 31, 33, respectively.

The field oxide film 39 is then formed on the substrate 25 between the first and second trenches 31, 33. To form the field oxide film 39 a pad oxide film (not shown) is first formed on the single crystal silicon layer patterns 37a, 37b and the semiconductor substrate 25. Then, a mask layer (not shown) is formed by depositing silicon nitride on the pad oxide film by CVD. Next, the mask layer and the pad oxide film are patterned by photo-etching to expose portions of the surface of the semiconductor substrate 25 between the trenches 31, 33, to define the HV, LV, and field F1 regions, respectively. Finally, the exposed surface of the semiconductor substrate 25 is oxidized by heat oxidation, thus completing the formation of the field oxide film 39 that isolates the HV device region from the LV device region. Background art processes are then applied to complete the fabrication of an integrated circuit.

Figure 5:
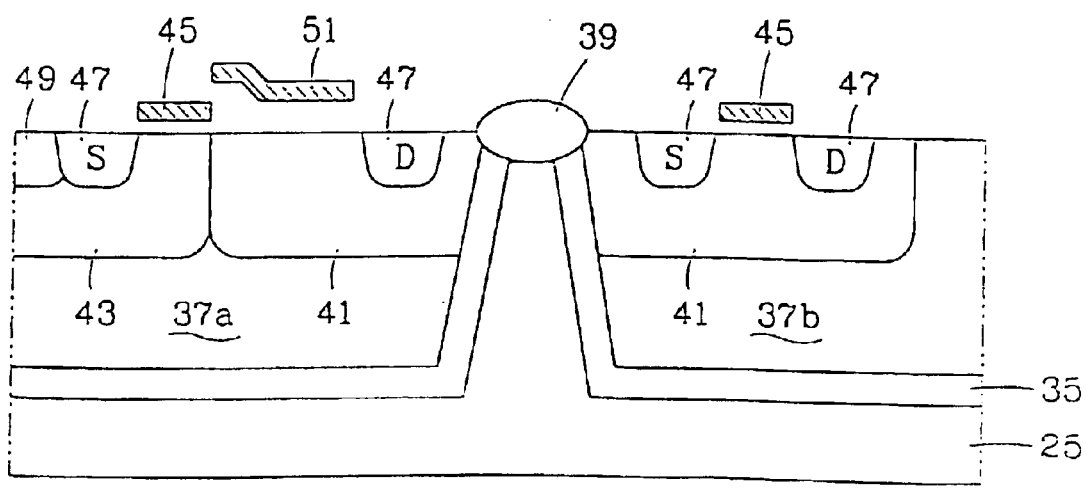
FIG. 5 illustrates a cross-sectional view of a semiconductor device fabricated on the structure shown in FIG. 4D.

FIG. 5 illustrates a cross-sectional view of a semiconductor device fabricated using the structure of FIG. 4D. Conductive type drift regions 41 are formed in the first and second single crystal silicon layer patterns 37a, 37b of the HV and LV regions, respectively, and a first conductive type well region 43 is formed adjacent to the drift region 41 of the HV region. The drift region 41 and the well region 43 preferably have the same depth, and are preferably formed using separate processes.

Gate electrodes 45, each having a gate insulating film (not shown), are formed on the first and second single crystal silicon layer patterns 37a, 37b of the HV and LV regions, respectively, and second conductive type impurity regions 47 are formed in the single crystal silicon layer patterns 37a, 37b at both sides of each gate electrode 45. The second conductive type impurity regions 47 are used as source S and drain D regions. A first conductive type body contact region 49 is then formed, contacting the source region S of the HV region.

In the HV region, the source region S forms in the well region 43 and the drain region D forms in the drift region 41, distant from the gate electrode 45. In the LV region, the source S and drain D regions form in the drift region 41. Further, a metal field plate electrode 51 is formed on the first single crystal silicon layer 37a in the drift region 41 of the HV region, and the plate electrode 51 is insulated from the single crystal silicon layer 37a and the gate electrode 45. The first and second conductive types have opposite impurity types.

The semiconductor device isolation structure and method embodying the present invention has various advantages.

The structure and method of the present invention can be applied to all semiconductor integrated circuits fabricated using the SOI substrate. By increasing thermal capacity inside the device in the integrated circuit employing the HV device, the present invention obviates a disadvantage of the background art method that results in a heat conduction problem. In addition, the present invention can improve the quality of the SOI substrate and implement self-fabrication of the SOI substrate. Further, the fabrication cost of the integrated circuit can be reduced, since the complex and costly background art SOI substrate is not required.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for making a semiconductor substrate, comprising:

forming first and second trenches on a semiconductor on insulator (SOI) substrate, wherein said forming of the first and second trenches comprises forming a pad oxide film on the SOI substrate, forming a mask layer on the pad oxide film, partially exposing an upper surface of the SOI substrate by removing parts of the pad oxide film and the mask layer corresponding to the first and second trenches, and applying an anisotropic etching process to the SOI substrate using the remaining mask layer as an etching mask;

forming a first insulating film on the first and second trenches;

forming first conductive type patterns over the SOI substrate, including the first and second trenches filling in the first and second trenches; and forming a second insulating film by oxidizing an exposed part of the SOI substrate between the first and second trenches without a mask, wherein said forming first conductive type pattern in said second trench comprises forming a low voltage device and said forming first conductive type pattern in said first trench comprises forming a high voltage device.

2. The method of claim 1, wherein the first and second trenches, the first insulating film and the first conductive type patterns are formed by a single process.

3. The method of claim 1, wherein said forming of said second insulating film comprises forming a field oxide film between adjacent source and drain regions.

4. The method of claim 1, wherein said forming first and second trenches leaves a portion of said SOI substrate between a high voltage device and a low voltage device separating said high voltage device and said low voltage device.

5. The method of claim 1, wherein said second insulating film comprises a field oxide film formed between a high voltage device and a low voltage device.

6. The method of claim 1, wherein said second insulating film is formed in contact with said first conductive type patterns in said first and second trenches.

7. The method of claim 6, wherein said second insulating film is formed in contact with said first insulating film and said SOI substrate.

8. A method for making a semiconductor device, comprising:

forming first and second trenches by applying an etching process to a semiconductor substrate using an etching mask;

forming first conductive type patterns in the first and second trenches, wherein said forming first conductive type pattern in said second trench comprises forming a low voltage device and the forming first conductive type pattern in said first trench comprises forming a high voltage device; and forming a second insulating film by oxidizing an exposed portion of the semiconductor substrate without a mask, wherein said second insulating film is formed between adjacent source and drain regions, and the forming second insulating film comprises forming a field oxide film between the high voltage device and the low voltage device.

9. The method of claim 8, wherein said forming first and second trenches leaves a portion of said semiconductor substrate between a high voltage device and a low voltage device.

10. The method of claim 8, wherein said second insulating film is formed in contact with said first conductive type patterns in said first and second trenches.

11. The method of claim 10, wherein said second insulating film is formed in contact with a first insulating film formed in said first and second trenches and also in contact with said semiconductor substrate.

12. The method of claim 8, further comprising:

forming a pad oxide film on the semiconductor substrate;

forming a mask layer on the pad oxide film;

partially exposing an upper surface of the semiconductor substrate by removing parts of the pad oxide film and the mask layer corresponding to first and second trench regions; and forming a first insulating film in the first and second trenches.

13. A method of making a semiconductor device, comprising:

forming first and second trenches by etching a semiconductor on insulator (SOI) substrate using an etching mask;

forming a first conductive type pattern over the SOI substrate filling in the trenches, wherein said forming first conductive pattern in said second trench comprises forming a low voltage device and said forming first conductive type pattern in said first trench comprises forming a high voltage device; and forming a second insulating film by oxidizing an exposed part of the SOI substrate without a mask, wherein a portion of said SOI substrate separates a high voltage device and a low voltage device, wherein the forming said second insulating film comprises forming a field oxide film between the high voltage device and the low voltage device.

14. The method of claim 13, wherein said second insulating film is formed in contact with said first conductive type patterns in said first and second trenches.

15. The method of claim 14, wherein said second insulating film is formed in contact with a first insulating film formed in said first and second trenches and in contact with said SOI substrate.

16. The method of claim 13, wherein said forming first and second trenches leaves a portion of said SOI substrate between a high voltage device and a low voltage device separating said high voltage device and said low voltage device.

17. The method of claim 13, further comprising:

forming a pad oxide film on the SOI substrate;

forming a mask layer on the pad oxide film;

removing parts of the pad oxide film and the mask layer corresponding to first and second trench regions;

forming a first insulating film in the first and second trenches;

forming a second conductive type drift region in single crystal silicon patterns formed in the first and second trenches, respectively;

forming a first conductive type well region in the first trench;

forming gate electrodes on predetermined regions of the single crystal formed in the first and second trenches, the gate electrodes having a gate therein;

forming impurity regions in the single crystal silicon patterns at both sides of the gate electrodes, the impurity regions being used as source or a drain;

forming a first conductive type body contact region in a well region of an silicon patterns insulating film HV region; and forming a metal field plate electrode on a part of the single crystal silicon pattern corresponding to the drift region in the first trench.

\* \* \* \* \*